United States Patent [19]
Kawahara et al.

[11] Patent Number: 4,847,816
[45] Date of Patent: Jul. 11, 1989

[54] AUDIO INFORMATION REPRODUCING APPARATUS

[75] Inventors: Yasunari Kawahara; Hideyo Kamiyama, both of Saitama, Japan

[73] Assignee: Pioneer Electronic Corporation, Japan

[21] Appl. No.: 166,344

[22] Filed: Mar. 10, 1988

[30] Foreign Application Priority Data

Mar. 12, 1987 [JP] Japan ............................. 62-36865[U]

[51] Int. Cl.$^4$ .............................................. G11B 7/00
[52] U.S. Cl. ...................................... 369/86; 369/134; 358/341
[58] Field of Search ....................... 369/86, 92, 48, 49, 369/134; 360/19.1, 20; 358/341–343

[56] References Cited
U.S. PATENT DOCUMENTS 4,393,489 7/1983 Mehrotra .............................. 369/86
4,794,465 12/1988 Balthasar et al. ................... 358/341

Primary Examiner—Robert L. Richardson
Attorney, Agent, or Firm—Sughrue, Mion, Zinn, Macpeak & Seas

[57] ABSTRACT

An information reproducing apparatus which enables regulation of sound volume levels of signals reproduced from a multiple-audio recording medium in which one of a plurality of audio information signals may be reproduced in conjunction with video information. The multiple-audio signals are recorded on a surface of a video disk, along with the video information. A code signal indicative of presence of multiple-audio information also is recorded, and is detected by code reading circuitry in the apparatus. Operation of changeover circuitry is controlled in accordance with the presence or absence of the code signal, and also in accordance with operation of a microphone in a microphone mixing mode.

6 Claims, 1 Drawing Sheet

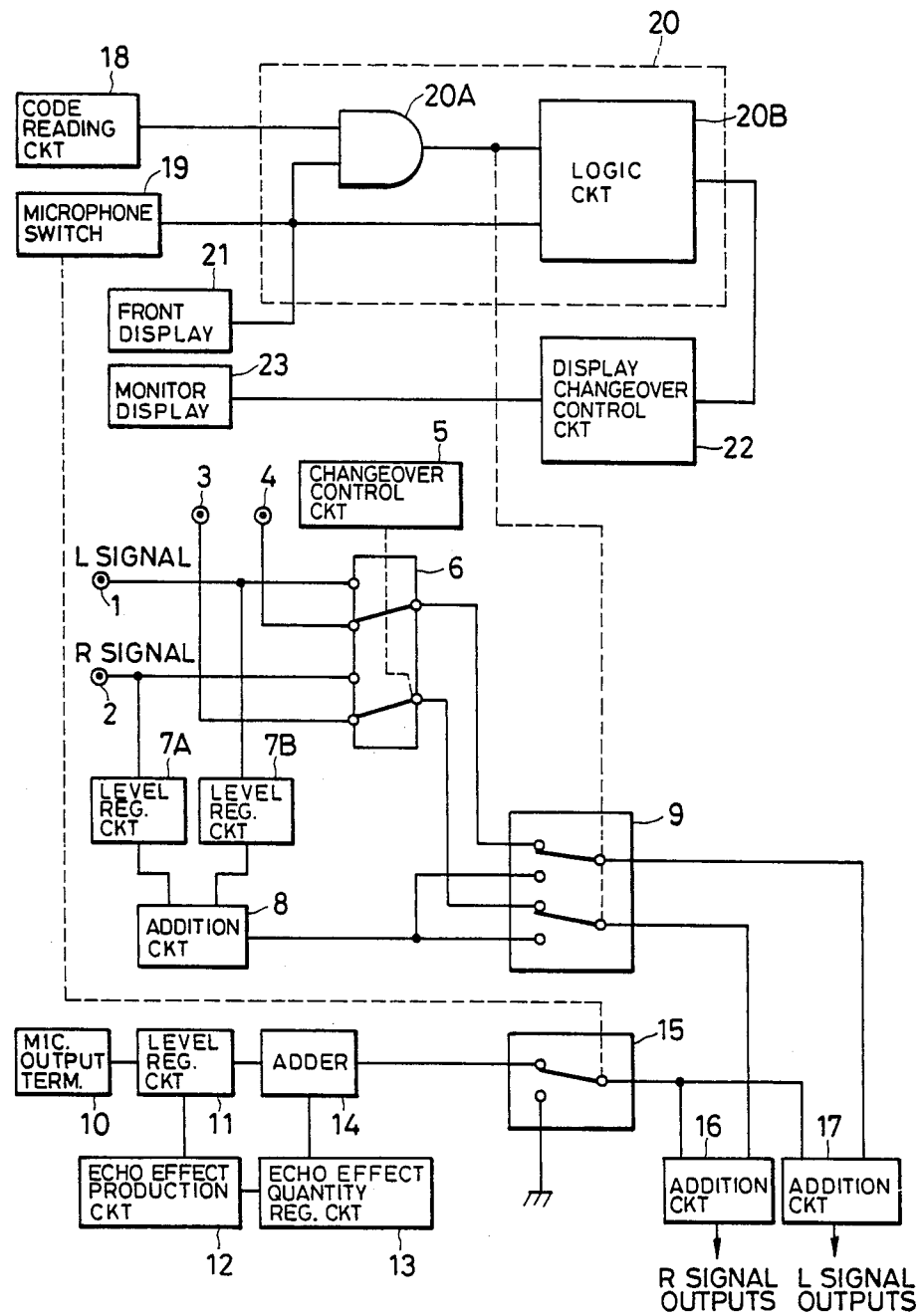

AUDIO INFORMATION REPRODUCING APPARATUS

BACKGROUND OF THE INVENTION

The present invention relates to an information reproducing apparatus such as a video disk player. In particular, the invention relates to an apparatus for reproducing a multiple-audio signal in which, for example, different types of audio information are recorded for selective reproduction, in accordance with a user's wishes, in association with video information. For example, a sound track for a movie recorded on a video disk may be recorded in different languages in sync with the frames of the movie. A viewer then would have the option of watching the movie while listening to the sound track in any one of the languages.

An information reproducing apparatus such as a video disk player picks up a video signal and an audio signal from a recording medium and supplies those signals to a television set so that a picture and accompanying sound are reproduced. When a stereo audio signal, consisting of right and left channel audio signals, is supplied from the information reproducing apparatus to a multiple-audio television set capable of receiving a stereo sound program in multiple-audio format, stereo sound recorded on the recording medium can be reproduced.

In a conventional information reproducing apparatus, right and left channel reproduced audio signals which are obtained from a multiple-audio recording medium are selected by a stereo mode changeover circuit of the apparatus or by the use of a mode changeover circuit in an amplifier. The audio signals for the right and the left channels are balanced with respect to each other by a balance control circuit.

When the information reproducing apparatus reproduces signals from the multiple-audio recording medium, the reproduced signals are transmitted from the mode changeover circuit to the balance control circuit or vice versa. When the reproduced signals are transmitted from the mode changeover circuit to the balance control circuit, the output from the mode changeover circuit cannot be controlled with certainty, even if the variable resistor, used for achieving balancing in the balance control circuit, is manipulated. For that reason, although an input signal in a predetermined channel, such as a right channel vocal signal, can be either erased or reproduced in a conventional information reproducing apparatus, the apparatus is disadvantageous in that the sound volume in the predetermined channel cannot be regulated as desired.

SUMMARY OF THE INVENTION

In view of the foregoing and other deficiencies, it is an object of the present invention to provide an information reproducing apparatus in which sound volume derived from a reproduced signal in a predetermined channel can be changed as desired during audio reproduction from a multiple-audio recording medium.

To accomplish the foregoing and other objects, the information reproducing apparatus according to the present invention comprises a pair of level regulation circuits for regulating the levels of a pair of reproduced audio signals; an addition circuit for adding together the outputs from the level regulation circuits; a selection circuit for selecting either the output from the addition circuit or the inputs to the level regulation circuits; and a code reading circuit for detecting signal information recorded on a recording medium on which the pair of audio signals are recorded.

According to the operation of the invention, if a multiple-audio signal code is detected by the code reading circuit, the selection circuit selects the output from the addition circuit so that the selected output resulting from adding the pair of audio signals together is sent out from the selection circuit.

When the multiple-audio recording medium is reproduced, the multiple-audio signal code is read automatically so that the levels of the right and the left reproduced audio signals and that of a microphone output signal can be regulated independently of each other. For that reason, various functions can be added during the reproduction, such as microphone output mixing or the like. As a result, multiple-audio mode may be used more widely.

BRIEF DESCRIPTION OF THE DRAWING

The sole FIGURE is a block diagram of an information reproducing apparatus according to one embodiment of the present invention.

DETAILED DESCRIPTION OF A PREFERRED EMBODIMENT

An embodiment of the present invention now will be described in detail with reference to the accompanying drawing. In the information reproducing apparatus, left and right channel reproduced audio signals from a multiple-audio recording medium are applied to internal input terminals 1 and 2, respectively. Right and left channel digital signals are supplied to external input terminals 3 and 4, respectively.

A changeover control circuit 5 controls a changeover circuit 6 for selecting either the internal input terminals 1 and 2 or the external input terminals 3 and 4 as the signals input. The levels of the left and right reproduced audio signals applied to the internal input terminals 1 and 2 are regulated by level regulation circuits 7A and 7B, respectively. The level regulated left and right reproduced audio signals are added together in an addition circuit 8. A selection circuit 9 selects either the output from the addition circuit 8 or the pair of left and right reproduced audio signals from the terminals 1 and 2.

When a microphone is being used, a microphone output signal from a microphone (not shown) is applied to a microphone output signal terminal 10. The level of the microphone output signal is regulated by a level regulation circuit 11. An echo effect is given to the microphone output signal by an echo effect production circuit 12. The quantity of the echo effect signal is regulated by an echo effect quantity regulation circuit 13. The microphone output signal and the regulated echo effect signal are added together in an adder 14, the output of which is connected to one terminal of a changeover circuit 15. The changeover circuit 15 selects either the output of the adder 14, or a ground voltage, and applied it to addition circuits 16 and 17.

When a microphone is being used, a microphone switch 19 is turned on so that a microphone switch signal is sent out to control the changeover circuit 15, as shown by the dotted line. In accordance with the state of the changeover circuit 15, the output of the adder 14 may be passed to addition circuits 16 and 17, as mentioned above. The outputs from the selection circuit 9 and the changeover circuit 15 then are added together by addition circuits 16 and 17 which send out a right and a left signal, respectively.

A multiple-audio signal code (such as a bilingual signal code, indicating that audio information in two different languages has been recorded) is recorded on the multiple-audio recording medium, and is read by a code reading circuit 18. Responsive to that multiple-audio signal code, the code reading circuit 18 sends out a code signal.

A control circuit 20, which includes an AND circuit 20A and a logic circuit 20B, receives the code signal from the code reading circuit 18 and the microphone switch signal from the microphone switch 19 at respective inputs of the AND circuit. The logic circuit 20B also receives the microphone switch signal. In accordance with these signals, the control circuit 20 controls the selection circuit 9 and a display changeover control circuit 22 in the following manner.

The AND circuit 20A receives the code signal and the microphone switch signal. The output from the AND circuit 20A is applied to the logic circuit 20B and also serves as a control signal for controlling the selection circuit 9. The logic circuit 20B receives the output (multiple-audio code signal) from the AND circuit 20A and the microphone switch signal. A control signal for displaying one of a multiple-audio mode, a microphone output mixing mode, or a normal mode is sent out from the logic circuit 20B to the display changeover control circuit 22. A front display unit 21 is provided on the front panel of the information reproducing apparatus as a visual indicator of the presence or absence of the microphone switch signal. A monitor display unit 23 provides visual indication of whether the apparatus is in multiple-audio mode, microphone output mixing mode, or a normal mode, in accordance with the presence or absence of the code signal and the microphone switch signal.

The operation of the information reproducing apparatus having circuitry as set forth above now will be described. In multiple-audio mode, the code signal and the microphone switch signal are applied to the control circuit 20, which puts the selection circuit 9 in multiple-audio mode. As a result, the output from the addition circuit 8 and the microphone output signal are added together by the addition circuits 16 and 17, which provide outputs accordingly. At that time, the display changeover control circuit 22 causes the front display unit 21 and the monitor display unit 23 to indicate that the apparatus is in multiple-audio mode. For these reasons, the levels of the right and the left reproduced audio signals and the microphone output signal can be regulated independently of each other in the multiple-audio mode.

In the ordinary microphone output mixing mode, the selection circuit 9 is connected to the internal input terminals 1 and 2 so that the left and the right reproduced audio signals are sent out from the selection circuit 9. The microphone output signal is added to the individual left and right reproduced audio signals.

In the normal mode, the microphone switch 19 switches the changeover circuit 15 away from the output of the adder 14. Thus, the addition circuits 16 and 17 output either the left and right signals at terminals 1 and 2, or the digital signals at terminals 3 and 4, in accordance with the indication provided by the changeover control circuit 5. The selection circuit 9, controlled by the output of AND circuit 20A, receiving no microphone switch signal from the circuit 19, will select the output of the changeover circuit 6, rather than the output of the addition circuit 8.

As described above, in accordance with the present invention, levels of the input reproduced audio signals can be regulated and adjusted independently by the provided pair of level regulation circuits, even in a multiple-audio mode. Of course, the scope of the invention is not to be considered as limited by the foregoing description, but rather is limited only by the scope of the appended claims which follow immediately.

What is claimed is:

1. An information reproducing apparatus for reproducing at least one of a pair of left and right input audio signals, a pair of input left and right digital signals, and a microphone output signal, said apparatus comprising:
   a pair of level regulation circuits for regulating levels of said pair of input audio signals;
   an addition circuit for adding together outputs of said level regulation circuits and providing a first added output accordingly;
   a first selection circuit for selecting between said first added output and said input audio signals;
   a code reading circuit for detecting a signal code recorded on a recording medium on which said pair of input audio signals are recorded, said signal code being indicative of at least a multiple-audio format for said input audio signals; and
   a control circuit receiving at least an output of said code reading circuit,
   wherein when a multiple-audio signal code is detected by said code reading circuit, said information reproducing apparatus operates in a multiple-audio mode, said first added output being selected by said first selection circuit, so that said first added output is output by said first selection circuit.

2. An information reproducing apparatus as claimed in claim 1, further comprising:
   means for receiving an output of a microphone associated with said information reproducing apparatus;
   a microphone switch circuit providing a microphone switch signal when said microphone output is present;
   a second selection circuit for selectively providing one of said microphone output and a neutral output; and
   means for combining said microphone output and said selection circuit;
   wherein said control circuit receives an output of said microphone switch circuit, said information reproducing apparatus operating in a microphone mixing mode in accordance with a first state of said microphone switch circuit and presence of said multipleaudio signal code; and
   wherein when said information reproducing apparatus is in said microphone mixing mode, said control circuit controls said first selection circuit such that said microphone output is combined with said input audio signals in said combining means; and
   wherein when said information reproducing apparatus is in said multiple-audio mode, said control circuit controls said first selection circuit such that said first added output is combined with an output of said second selection circuit in said combining means.

3. An information reproducing apparatus as claimed in claim 2, further comprising:

means for regulating a level of said microphone output; and means for producing an echo effect for said microphone output, wherein said microphone output is provided to said second selection circuit in accordance with operation of said microphone output level regulating means and said echo effect producing means.

4. An information reproducing apparatus as claimed in claim 1, further comprising changeover control circuitry for selecting between one of said input audio signals and said input digital signals.

5. An information reproducing apparatus as claimed in claim 1, wherein when said microphone switch signal and said multiple-audio signal are not present, said information reproducing apparatus operates in a normal mode, wherein said second selection circuit selects said neutral output, and one of said pair of input audio signals and said pair of input digital signals are provided to said combining means and are output directly therefrom without being combined with any other signals in said combining means.

6. An information reproducing apparatus as claimed in claim 5, further comprising:

a display changeover control circuit connected to an output of said control circuit;

a front display for providing a visual indication of presence or absence of said microphone output; and a monitor display receiving an output of said display changeover control circuit, for providing visual indication of one of said multiple-audio mode, said microphone mixing mode, or said normal mode of operation of said information reproducing apparatus.

* * * * *